United States Patent
Brown et al.

(10) Patent No.: US 10,517,198 B1
(45) Date of Patent: Dec. 24, 2019

(54) CABLE HAVING SHIELDING TAPE WITH CONDUCTIVE SHIELDING SEGMENTS

(71) Applicant: General Cable Technologies Corporation, Highland Heights, KY (US)

(72) Inventors: Scott M. Brown, Independence, KY (US); Stephen A. Thwaites, Walton, KY (US); James D. Malkemus, Union, KY (US)

(73) Assignee: General Cable Technologies Corporation, Highland Heights, KY (US)

( * ) Notice: Subject to any disclaimer, the term of this patent is extended or adjusted under 35 U.S.C. 154(b) by 0 days.

(21) Appl. No.: 16/439,835

(22) Filed: Jun. 13, 2019

Related U.S. Application Data

(60) Provisional application No. 62/684,902, filed on Jun. 14, 2018.

(51) Int. Cl.
| | | |
|---|---|---|
| *H05K 9/00* | (2006.01) | |
| *H01B 7/02* | (2006.01) | |
| *H01B 11/06* | (2006.01) | |
| *H01B 7/22* | (2006.01) | |
| *H01B 9/02* | (2006.01) | |

(Continued)

(52) U.S. Cl.
CPC ......... *H05K 9/0098* (2013.01); *H01B 7/0216* (2013.01); *H01B 7/22* (2013.01); *H01B 7/221* (2013.01); *H01B 7/226* (2013.01); *H01B 9/021* (2013.01); *H01B 11/06* (2013.01); *H01B 11/085* (2013.01); *H01B 11/10* (2013.01); *H01B 11/1008* (2013.01); *H01B 11/1016* (2013.01); *H01B 11/183* (2013.01); *H01B 11/1826* (2013.01)

(58) Field of Classification Search
CPC ........ H01B 9/021; H01B 11/08; H01B 11/10; H01B 11/1008; H01B 11/1016; H01B 11/1025; H01B 11/1826; H01B 11/183; H01B 11/085; H01B 7/22; H01B 7/221; H01B 7/226; H05K 9/0098
See application file for complete search history.

(56) References Cited

U.S. PATENT DOCUMENTS

| | | |
|---|---|---|
| 1,132,452 A | 3/1915 | Davis |
| 3,090,825 A | 5/1963 | Volk |

(Continued)

FOREIGN PATENT DOCUMENTS

| | | |
|---|---|---|
| AU | 1524097 A | 8/1997 |
| BR | 9706962 A | 10/2000 |

(Continued)

*Primary Examiner* — Timothy J Thompson
*Assistant Examiner* — Rhadames Alonzo Miller
(74) *Attorney, Agent, or Firm* — Ulmer & Berne LLP

(57) ABSTRACT

A cable includes a first twisted pair of insulated conductors, a second twisted pair of insulated conductors, a shielding tape, and an outer jacket surrounding the first twisted pair of insulated conductors, the second twisted pair of insulated conductors and the shielding tape. The shielding tape includes a substrate and a plurality of conductive shielding segments. The plurality of conductive shielding segments is disposed on the substrate. Each conductive shielding segment is spaced from each immediately adjacent conductive shielding segment in a longitudinal direction.

23 Claims, 5 Drawing Sheets

(51) Int. Cl.
*H01B 11/18* (2006.01)
*H01B 11/08* (2006.01)
*H01B 11/10* (2006.01)

(56) References Cited

U.S. PATENT DOCUMENTS

| | | | |
|---|---|---|---|
| 3,312,774 A | | 4/1967 | Peterson |
| 3,770,570 A | | 11/1973 | Swearingen et al. |
| 3,870,977 A | | 3/1975 | Peoples |
| 4,129,841 A | | 12/1978 | Hildebrand et al. |
| 4,596,897 A | | 6/1986 | Gruhn |
| 4,746,767 A | * | 5/1988 | Gruhn ............... H01B 11/1016 174/105 R |
| 5,008,489 A | * | 4/1991 | Weeks, Jr. ........... H01B 7/0861 156/291 |
| 5,473,336 A | | 12/1995 | Harman et al. |
| 5,767,441 A | | 6/1998 | Brorein et al. |
| 5,855,988 A | | 1/1999 | Matsuo |
| 6,248,954 B1 | * | 6/2001 | Clark .................. H01B 11/04 174/113 R |
| 6,254,924 B1 | | 7/2001 | Brorein et al. |
| 6,288,340 B1 | * | 9/2001 | Arnould ........... H01B 13/2673 174/113 R |
| 6,597,067 B1 | | 7/2003 | Biery et al. |
| 6,802,743 B2 | | 10/2004 | Aekins et al. |
| 6,893,296 B2 | | 5/2005 | Aekins et al. |
| 7,078,614 B1 | | 7/2006 | Van Haaster |
| 7,332,676 B2 | | 2/2008 | Sparrowhawk |
| 7,335,837 B2 | * | 2/2008 | Pfeiler ................ H01B 11/085 174/113 C |
| 7,530,854 B2 | | 5/2009 | Aekins |
| 7,532,794 B2 | | 5/2009 | Cook |
| 7,534,964 B2 | * | 5/2009 | Clark .................. H01B 11/06 174/113 AS |
| 7,555,350 B2 | | 6/2009 | MacDonald |
| 7,637,776 B2 | | 12/2009 | McNutt et al. |
| 7,639,205 B2 | | 12/2009 | Kudou et al. |
| 7,790,981 B2 | | 9/2010 | Vaupotic et al. |
| 7,804,439 B2 | | 9/2010 | Yoshida et al. |
| 7,834,270 B2 | | 11/2010 | Zhu et al. |
| 7,834,271 B2 | | 11/2010 | Gromko et al. |
| RE42,266 E | | 4/2011 | Sparrowhawk |
| 7,923,641 B2 | * | 4/2011 | Smith ............... H01B 11/1008 174/113 R |
| 8,119,906 B1 | * | 2/2012 | Smith ............... H01B 11/1008 174/36 |
| 8,119,907 B1 | | 2/2012 | McNutt |
| 8,183,462 B2 | | 5/2012 | Nordin et al. |
| 8,217,267 B2 | | 7/2012 | Nordin et al. |
| 8,354,590 B2 | | 1/2013 | Nordin et al. |
| 8,395,045 B2 | | 3/2013 | Smith et al. |
| 8,445,787 B2 | * | 5/2013 | Nordin .................. H01B 11/085 174/110 R |
| 8,558,115 B2 | | 10/2013 | Jenner et al. |
| 8,629,351 B2 | | 1/2014 | Asplund et al. |
| 8,927,866 B2 | | 1/2015 | Nordin et al. |
| 8,946,555 B2 | | 2/2015 | Nordin et al. |
| 8,987,591 B2 | | 3/2015 | Nordin et al. |
| 9,044,593 B2 | | 6/2015 | Li et al. |
| 9,048,007 B2 | | 6/2015 | Hailong et al. |
| 9,072,192 B2 | | 6/2015 | Lin et al. |
| 9,087,630 B2 | | 7/2015 | Camp, II et al. |
| 9,129,727 B2 | | 9/2015 | Caveney et al. |
| 9,136,043 B2 | | 9/2015 | Brown et al. |
| 9,196,398 B2 | | 11/2015 | Kroushl et al. |
| 9,202,610 B2 | | 12/2015 | Gould et al. |
| 9,251,930 B1 | | 2/2016 | McNutt |
| 9,275,776 B1 | * | 3/2016 | McNut ............... H01B 11/1008 |
| 9,362,027 B2 | | 6/2016 | Kenny et al. |
| 9,412,498 B2 | | 8/2016 | Wassmuth et al. |
| 9,424,964 B1 | * | 8/2016 | Kithuka ............... H01B 11/1008 |
| 9,520,210 B1 | * | 12/2016 | Neveux ............... G02B 6/4495 439/98 |
| 2004/0026113 A1 | * | 2/2004 | Bahlmann ............ H01B 11/06 174/113 C |
| 2004/0055781 A1 | * | 3/2004 | Cornibert ............ H01B 11/06 174/135 |
| 2006/0048961 A1 | * | 3/2006 | Pfeiler ................. H01B 11/085 174/36 |
| 2007/0037419 A1 | * | 2/2007 | Sparrowhawk .... H01B 11/1008 439/98 |
| 2009/0223694 A1 | * | 9/2009 | Nordin ............... H01B 11/1008 174/34 |
| 2010/0117660 A1 | * | 5/2010 | Douglas ............... H03K 17/955 324/658 |
| 2010/0157566 A1 | | 6/2010 | Bogursky et al. |
| 2012/0067614 A1 | | 3/2012 | Camp, II et al. |
| 2012/0080209 A1 | | 4/2012 | McLinn et al. |
| 2012/0080210 A1 | | 4/2012 | Camp, II et al. |
| 2012/0080211 A1 | | 4/2012 | Brown et al. |
| 2012/0145429 A1 | * | 6/2012 | Nordin ................ H01B 11/203 174/34 |
| 2012/0177906 A1 | | 7/2012 | Sousa et al. |
| 2013/0008684 A1 | | 1/2013 | Weitzel et al. |
| 2013/0161063 A1 | | 6/2013 | Gould et al. |
| 2013/0333936 A1 | * | 12/2013 | Gundel ................ H01B 7/0838 174/350 |
| 2014/0262411 A1 | * | 9/2014 | Hopkinson ......... H01B 11/085 174/34 |
| 2016/0037691 A1 | * | 2/2016 | Kroushl ............... H05K 9/0086 428/43 |
| 2017/0320285 A1 | | 11/2017 | Jenner et al. |
| 2018/0033523 A1 | | 2/2018 | Kusuma et al. |

FOREIGN PATENT DOCUMENTS

| | | |
|---|---|---|
| CA | 2603101 A1 | 10/2006 |
| CN | 100553037 C | 10/2009 |
| DE | S9730009 T2 | 7/2005 |
| EP | 0016958 B1 | 6/1982 |
| EP | 1089605 A2 | 4/2001 |
| EP | D871964 B1 | 7/2004 |
| EP | 1872440 B1 | 1/2008 |
| EP | 2592631 A1 | 5/2013 |
| FR | 3029387 A3 | 6/2016 |
| GB | 1037944 | 8/1966 |
| GB | 2432963 A | 6/2007 |
| ID | 17205 A | 12/1997 |
| ID | 27079 A | 12/1997 |
| JP | S63-171912 A | 7/1988 |
| JP | H5-277661 A | 10/1993 |
| JP | H9-185913 A | 7/1997 |
| JP | 2009205828 A | 9/2009 |
| JP | 2013-225516 A | 10/2013 |
| JP | 2014-44956 A | 3/2014 |
| JP | 2014-150066 A | 8/2014 |
| JP | 2014-150067 A | 8/2014 |
| JP | 2014-239054 A | 12/2014 |
| JP | 2015-43328 A | 3/2015 |
| KR | 101127252 B1 | 3/2012 |
| WO | 9725725 A2 | 7/1997 |
| WO | 2004071144 A1 | 8/2004 |
| WO | 2006105166 A2 | 10/2006 |
| WO | 2010003215 A1 | 1/2010 |
| WO | 2010101912 A1 | 9/2010 |
| WO | 2014077492 A1 | 5/2014 |
| WO | 2015026029 A1 | 2/2015 |
| ZA | 9700022 B | 10/1997 |

* cited by examiner

CABLE HAVING SHIELDING TAPE WITH CONDUCTIVE SHIELDING SEGMENTS

REFERENCE TO RELATED APPLICATIONS

This application claims priority of U.S. provisional patent application Ser. No. 62/684,902, entitled Cable Having Shielding Tape with Conductive Shielding Segments, filed Jun. 14, 2018 and hereby incorporates this provisional patent application by reference herein in its entirety.

TECHNICAL FIELD

The articles and methods described below generally relate to cables having a shielding tape. The shielding tape includes discontinuous shielding segments.

BACKGROUND

Conventional data cables typically include twisted pairs of insulated conductors that are surrounded by a shield and/or are separated by a separator to alleviate signal interference among adjacent parallel conductors (crosstalk). These conventional arrangements can be bulky and expensive to manufacture.

U.S. Patent App. Pub. No. 2017/0320285 A1 describes in one embodiment a matrix tape that includes a support layer, a metallic layer composed of metallic segments attached to the support layer and a barrier layer attached to the support layer opposite the metallic layer. In another embodiment, a matrix tape includes a support layer, a metallic layer composed of metallic segments attached to the support layer and a strength member attached to the metallic layer opposite the support layer. In a third embodiment, a method of manufacturing a matrix tape includes providing a payout and an uptake reel. Dispensing a tape with a support layer and a metallic layer from the payout reel, ablating the metallic reel with a laser, attached at least one of a strength member or a barrier layer to the tape, and spooling the tape on the uptake reel.

U.S. Pat. No. 7,335,837 B2 describes a multi-layer, strip-type screening sheet for electric lines which comprises at least a substrate layer of plastic material and at least one screening layer of electrically conductive material, in particular metal, which the substrate layer is lined with, the screening layer being provided with spacing gaps that recur at longitudinal intervals for electrical interruption thereof in the longitudinal strip direction.

PCT Patent App. Pub. No. WO 2010/101912 A1 describes a cable foil tape having random or pseudo-random patterns or long pattern lengths of discontinuous metallic shapes and a method for manufacturing such patterned foil tape. In some embodiments, a laser ablation system is used to selectively remove regions or paths in a metallic layer of a foil tape to produce random distributions of randomized shapes, or pseudo-random patterns or long pattern lengths of discontinuous shapes in the metal layer. In some embodiments, the foil tape is double-sided, having a metallic layer on each side of the foil tape, and the laser ablation system is capable of ablating nonconductive pathways into the metallic layer on both sides of the foil tape.

SUMMARY

In accordance with one embodiment, a cable comprises a core, a shielding tape, and an outer jacket. The core comprises a first twisted pair of insulated conductors and a second twisted pair of insulated conductors. The shielding tape surrounds the first and second twisted pairs of insulated conductors and defines a longitudinal centerline. The shielding tape comprises a dielectric substrate and a shielding substrate. The shielding substrate is disposed on the dielectric substrate and comprises a plurality of conductive shielding segments. Each conductive shielding segment of the plurality of conductive shielding segments is spaced from an immediately adjacent conductive shielding segment such that the plurality of conductive shielding segments cooperate to define a path of electrical discontinuity that is routed longitudinally along the dielectric substrate in an oscillating pattern about the centerline. The outer jacket surrounds the first and second twisted pairs of insulated conductors and the shielding tape.

In accordance with another embodiment a cable comprises a core, a shielding tape, and an outer jacket. The core comprises a first twisted pair of insulated conductors and a second twisted pair of insulated conductors. The shielding tape surrounds the first and second twisted pairs of insulated conductors. The shielding tape comprises a dielectric substrate and a shielding substrate. The shielding substrate is disposed on the dielectric substrate and comprises a plurality of conductive shielding segments. Each conductive shielding segment of the plurality of conductive shielding segments is spaced from an immediately adjacent conductive shielding segment such that the plurality of conductive shielding segments cooperate to define a path of electrical discontinuity that is routed along the dielectric substrate. The outer jacket surrounds the first and second twisted pairs of insulated conductors and the shielding tape. The path comprises a first cycle portion and a second cycle portion. Each of the first cycle portion and the second cycle portion are either sinusoidally shaped or non-sinusoidally shaped.

In accordance with still yet another embodiment, a cable comprises a core, a shielding tape, and an outer jacket. The core comprises a first twisted pair of insulated conductors and a second twisted pair of insulated conductors. The shielding tape surrounds the first and second twisted pairs of insulated conductors and defines a longitudinal centerline. The shielding tape comprises a dielectric substrate and a shielding substrate. The shielding substrate is disposed on the dielectric substrate and comprises a plurality of conductive shielding segments. Each conductive shielding segment of the plurality of conductive shielding segments is spaced from an immediately adjacent conductive shielding segment such that the plurality of conductive shielding segments cooperate to define a first path of electrical discontinuity and a second path of electrical discontinuity that are each routed longitudinally along the dielectric substrate in an oscillating pattern about the centerline. The outer jacket surrounds the first and second twisted pairs of insulated conductors and the shielding tape. The first path and the second path are longitudinally offset from each other.

In accordance with still yet another embodiment, a cable comprises a core and a shielding tape. The core comprises a first twisted pair of insulated conductors and a second twisted pair of insulated conductors. The shielding tape surrounds the first and second twisted pairs of insulated conductors and defines a longitudinal centerline. The shielding tape comprises a dielectric substrate and a shielding substrate. The dielectric substrate has a width. The shielding substrate is disposed on the dielectric substrate and comprises a plurality of conductive shielding segments. Each conductive shielding segment of the plurality of conductive shielding segments comprises a length and a width. The length of each conductive shielding segment of the plurality of conductive shielding segments is different from the lengths of other conductive shielding segments of the plurality of conductive shielding segments. The width of each conductive shielding segment of the plurality of conductive shielding segments is substantially the same as the width of the dielectric substrate.

BRIEF DESCRIPTION OF THE DRAWINGS

It is believed that certain embodiments will be better understood from the following description taken in conjunction with the accompanying drawings in which.

DETAILED DESCRIPTION

Figure 1:
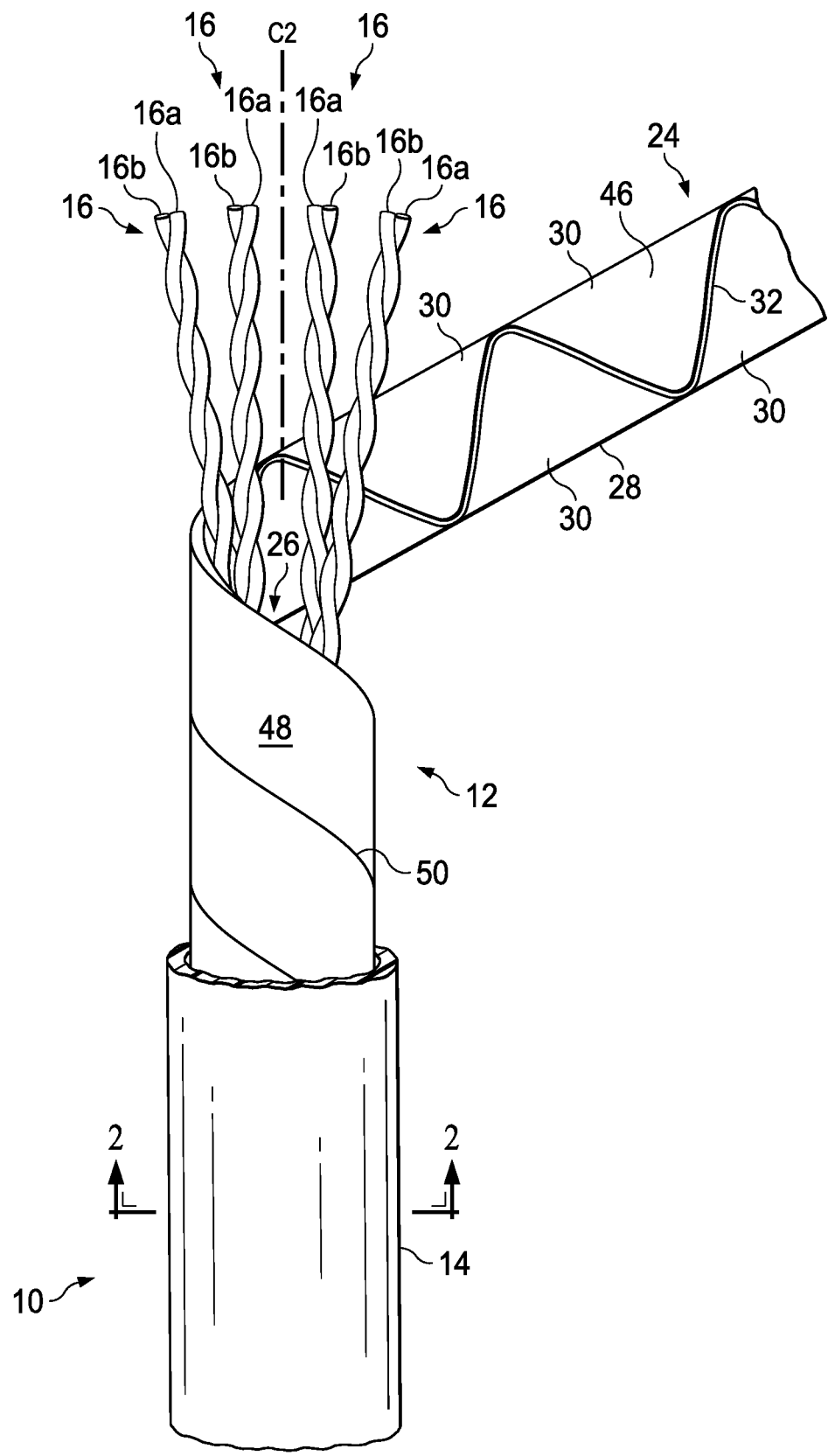
FIG. 1 is a perspective view depicting a cable at least partially unwound for clarity of illustration, in accordance with one embodiment.
Figure 2:
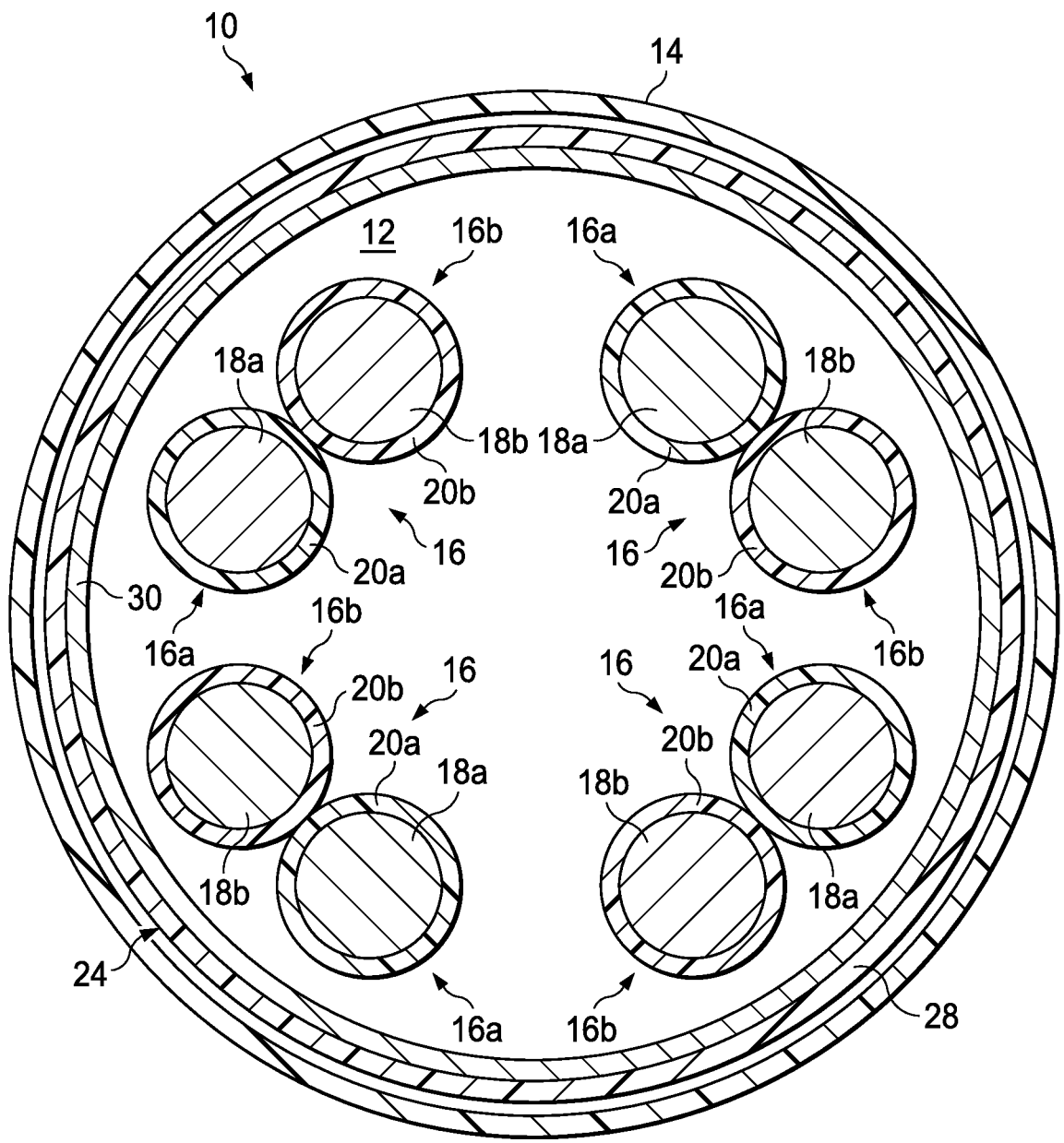
FIG. 2 is a cross-sectional view taken along the line 2-2 in FIG. 1.

In connection with the views and examples of FIGS. 1-11, wherein like numbers indicate the same or corresponding elements throughout the views, FIGS. 1 and 2 illustrate a cable 10 comprising a core 12 and an outer jacket 14 surrounding the core 12. The outer jacket 14 can be formed of an electrically insulating material, such as polyvinylchloride, for example. The core 12 can include a plurality of twisted pairs 16 of insulated conductors 16a, 16b. As illustrated in FIG. 2, each of the insulated conductors 16a, 16b can include respective conductive elements 18a, 18b that are coated with respective insulating layers 20a, 20b. The conductive elements 18a, 18b can be formed of copper, aluminum, or any of a variety of other suitable conductive materials. In one embodiment, the insulating layers 20a, 20b can be formed of a foamed material. The foamed material can provide enhanced insulating characteristics relative to a solid material due to the air voids imparted to the foamed material during manufacture. Foaming the insulating layers 20a, 20b can also allow the core 12 to be provided without a separate barrier layer. It is to be appreciated that the insulating layers 20a, 20b can be formed of any of a variety of insulating materials and in some cases might not be foamed.

The core 12 can also include a shielding tape 24 that surrounds the twisted pairs 16 such that the shielding tape 24 defines a passage 26 (FIG. 1) through which the twisted pairs 16 are routed. As illustrated in FIGS. 1 and 2, the shielding tape 24 can comprise a substrate 28 and a plurality of conductive shielding segments 30 disposed on the substrate 28. The substrate 28 can be formed of one or more non-conductive materials (e.g., dielectric material), and the plurality of conductive shielding segments 30 can be formed of a conductive material. In one embodiment, the substrate 28 can be formed of one or more layers of biaxially-oriented polyethylene terephthalate (PET) and the plurality of conductive shielding segments 30 can be formed of an aluminum alloy (e.g., an aluminum/PET tape). In some embodiments, the PET tape can be MYLAR.

It is to be appreciated that the substrate 28 can be formed of any of a variety of suitable additional or alternative insulating materials, such as, for example, an olefin (e.g., a polypropylene or polyvinylchloride), and/or a fluoropolymer, such as FEP, ECTFE, MFA, PFA and PTFE. The substrate 28 can, additionally or alternatively, include fibrous filler strands, such as, for example, woven or non-woven strands of fiberglass. These fibrous filler strands can be included in the substrate 28 to enhance the flame and smoke properties of the shielding tape 24. It is to be appreciated that the substrate 28 can be formed of a single layer of material or a plurality of the same or different materials. Although the conductive shielding segments 30 are described as being formed of aluminum, it is to be appreciated that the conductive shielding segments 30 can be formed of any of a variety of suitable additional or alternative conductive materials, such as, for example, pure aluminum or copper. In one embodiment, the conductive shielding segments 30 can have a thickness between about 0.0003 inches and about 0.0030 inches.

Figure 3:
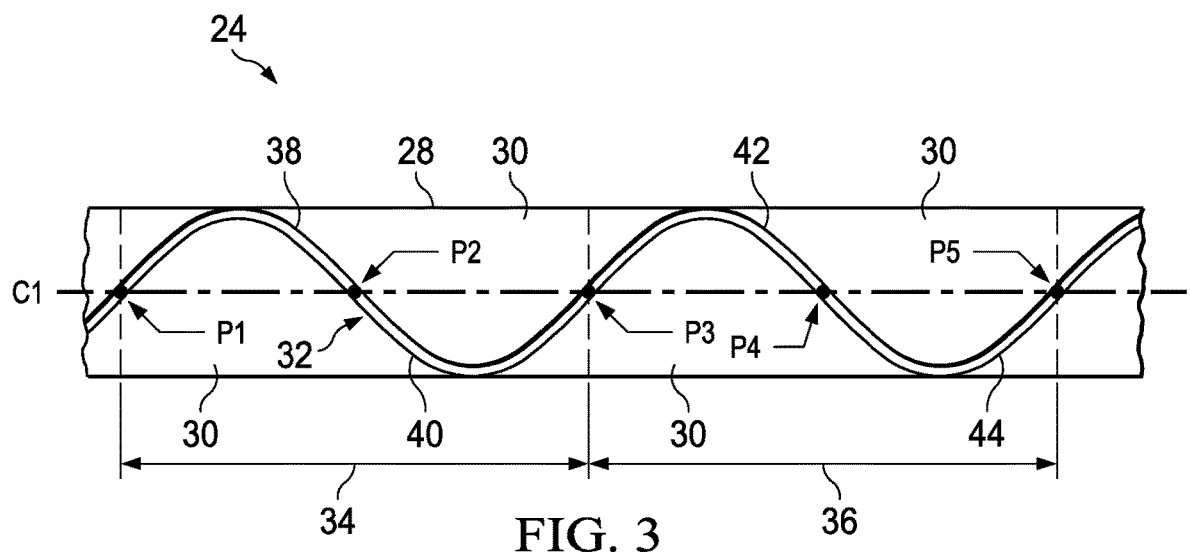
FIG. 3 is a top plan view depicting a shielding tape of the cable of FIG. 1, in accordance with one embodiment.

Referring now to FIG. 3, each of the conductive shielding segments 30 can be spaced from each immediately adjacent conductive shielding segment 30 in each of a longitudinal direction and a radial direction (i.e., parallel and perpendicular to a longitudinal centerline C1 defined by the shielding tape 24) such that the conductive shielding segments 30 cooperate to define a path 32 of electrical discontinuity that is routed along the substrate 28 in an oscillating pattern about the centerline C1. In one embodiment, the conductive shielding segments 30 can be sized to overlie at least about 90% of the substrate 28 (e.g., the path 32 exposes about 10% of the dielectric substrate between the conductive shielding segments 30). In one embodiment, the path 32 can be between about 10 microns and about 2000 microns thick and preferably between about 1300 and 1500 microns. It is to be appreciated that the path 32 can be formed through any of a variety of methods, such as, for example, by laser cutting the path 32 into a continuous sheet of conductive material (e.g., aluminum).

The path 32 is shown to intersect the centerline C1 at a first point P1, a second point P2, a third point P3, a fourth point P4, and a fifth point P5. The path 32 can include a first cycle portion 34 that extends between the first, second, and third points P1, P2, P3, and a second cycle portion 36 that extends between the third, fourth, and fifth points P3, P4, P5. The first cycle portion 34 can include a positive half cycle segment 38 that extends between the first and second points P1, P2 and a negative half cycle segment 40 that extends between the second and third points P2, P3. The second cycle portion 36 can include a positive half cycle segment 42 that extends between the third and fourth points P3, P4 and a negative half cycle segment 44 that extends between the fourth and fifth points P4, P5. Each of the first cycle portion 34 and the second cycle portion 36 can be sinusoidal-shaped. It is to be appreciated that a cycle portion being sinusoidal-shaped can be understood to mean that the positive half cycle segment (e.g., 38, 42) is substantially the same shape as the negative half cycle segment (e.g., 40, 44) but is a mirror image thereof relative to the centerline C1. In one embodiment, as illustrated in FIG. 3, the first and second cycle portions 34, 36 are shown to be similarly shaped such that the sinusoidal-shape of the path 32 is consistent between the first point P1 and the fifth point P5. As such, each of the conductive shielding segments 30 can be substantially bell-shaped and can have a substantially similar surface area as the other conductive shielding segments 30.

In one embodiment, the conductive shielding segments 30 can be adhered to the substrate 28 with an adhesive. In another embodiment, the conductive shielding segments 30 can be applied to the substrate 28 via an application process such as, for example, heat pressing, laser ablation, vapor deposition, or by spraying conductive particles onto the substrate 28. In yet another embodiment, the conductive shielding segments 30 can be conductive particles which are embedded in the substrate 28. These conductive particles can be formed of aluminum, iron oxides, nickel, zinc, silver, carbon nano-fibers, or any of a variety of suitable alternative conductive particulates.

Referring again to FIG. 1, in one embodiment, the substrate 28 is shown to include a first surface 46 and a second surface 48 that is opposite from the first surface 46 (e.g., opposing surfaces). In such an embodiment, the conductive shielding segments 30 can be disposed only on the first surface 46, such that the second surface 48 is devoid of conductive shielding segments (e.g., 30). In another embodiment, the conductive shielding segments 30 can be disposed on each of the first surface 46 and the second surface 48.

Still referring to FIG. 1, in one embodiment, the shielding tape 24 can be helically wound around the twisted pairs 16 with the conductive shielding segments 30 facing inwardly towards the twisted pairs 16. A portion of the shielding tape 24 can therefore overlap itself such that some portions of the conductive shielding segments 30 are in contact with the twisted pairs 16 and other portions of the conductive shielding segments 30 are sandwiched between overlapped portions of the shielding tape 24. With the shielding tape 24 helically wound around the twisted pairs 16, the substrate 28 can overlie each of the conductive shielding segments 30 relative to the passage 26 such that a substantial portion of the second surface 48 of the substrate 28 that is devoid of conductive shielding segments 30 defines an exterior surface of the shielding tape 24. In an alternative embodiment, the shielding tape 24 can be helically wound around the twisted pairs 16 with the conductive shielding segments 30 facing outwardly such that the second surface 48 faces inwardly towards the twisted pairs 16.

In one embodiment, the shielding tape 24 can be helically wound such that an exposed edge 50 of shielding tape 24 can lie at a wrap angle of about 15 degrees relative to a centerline C2 of the cable 10 with about a 25% overlap with adjacent portions of the shielding tape 24. It is to be appreciated that, although the shielding tape 24 is described as being helically wound around the twisted pairs 16, the shielding tape 24 can surround the twisted pairs 16 in any of a variety of suitable alternative arrangements. For example, the shielding tape 24 can surround the twisted pairs 16 in a cuffed arrangement such that the exposed edge 50 is substantially parallel with the longitudinal centerline C2 of the cable 10.

The conductive shielding segments 30 of the shielding tape 24 can be electrically discontinuous along the longitudinal centerline C1 of the cable 10 which can provide more effective shielding of the twisted pairs 16 than certain conventional grounded arrangements. For example, the conductive shielding segments 30 can reduce capacitive coupling between the twisted pairs 16 which can enhance the electromagnetic compatibility (EMC) performance and can provide more consistent high frequency impedance. Additionally, the physical characteristics of each conductive shielding segment 30 (e.g., the shape, the length, and/or the width) as well as the relationship between the conductive shielding segments 30 (e.g., the width of the path 32) can be selected to enhance the capacitive coupling between the conductive shielding segments 30 thereby enhancing the overall magnitude of the longitudinal impedance of the cable 10. As a result, the shielding tape 24 can provide reduced signal attenuation at high frequencies along the twisted pairs 16 which can reduce (e.g., flatten) the insertion loss curve as compared to a conventional unshielded arrangement. In addition, the shielding tape 24 can enhance the shielding between the twisted pairs 16, thereby improving near end crosstalk (NEXT), alien crosstalk (ANEXT), and high frequency attenuation-to-crosstalk ratio (ACR).

It is to be appreciated that the cable 10 can have any of a variety of suitable alternative components not illustrated herein such as a separator (e.g., flat separator or crossweb separator). In some embodiments, conductive shielding segments (e.g., 30) can be applied directly to the separator, as described in U.S. Pat. Pub. No. 2013/0008684 which is hereby incorporated by reference herein in its entirety. It is also to be appreciated that although the cable 10 is shown to include four twisted pairs 16 of wire, any quantity of twisted pairs is contemplated, such as one, two, three or more than four.

Figure 4:
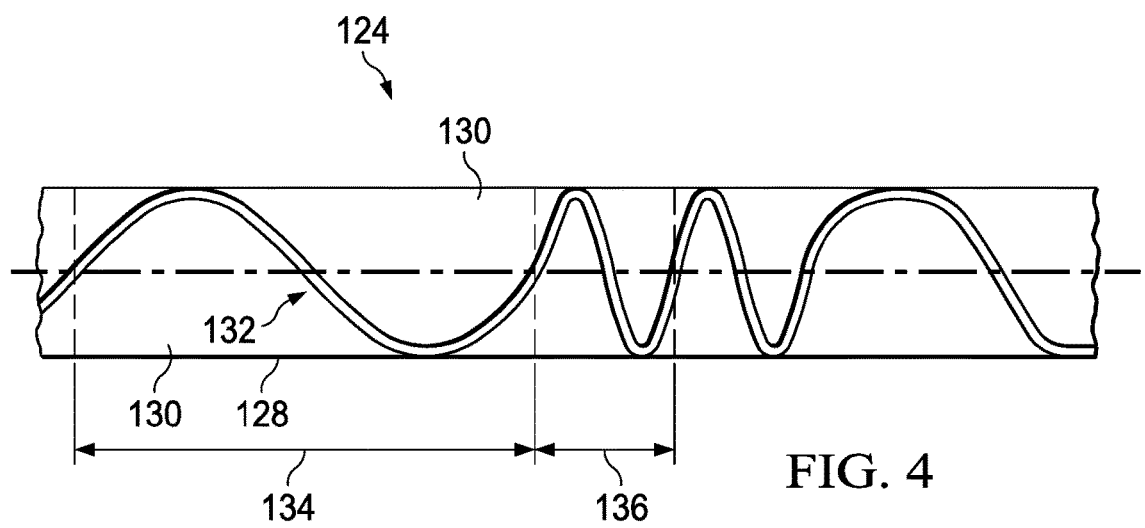
FIG. 4 is a top plan view depicting a shielding tape, in accordance with another embodiment.

FIG. 4 illustrates an alternative embodiment of a shielding tape 124 that can be similar to, or the same in many respects as, the shielding tape 24 of FIGS. 1-3. For example, the shielding tape 124 can include a substrate 128 and a plurality of conductive shielding segments 130 disposed on the substrate 128. Each of the conductive shielding segments 130 can cooperate to define a path 132 that includes a first cycle portion 134 and a second cycle portion 136. Each of the first cycle portion 134 and the second cycle portion 136 can be sinusoidal-shaped. However, the first and second cycle portions 134, 136 can have different sinusoidal-shapes such that the sinusoidal-shape of the second cycle portion 136 is more longitudinally compact than the first cycle portion 134. It is to be appreciated that the first and second cycle portions 134, 136 can have different sinusoidal shapes that additionally or alternatively result in one cycle portion being more laterally compact than the other.

Figure 5:
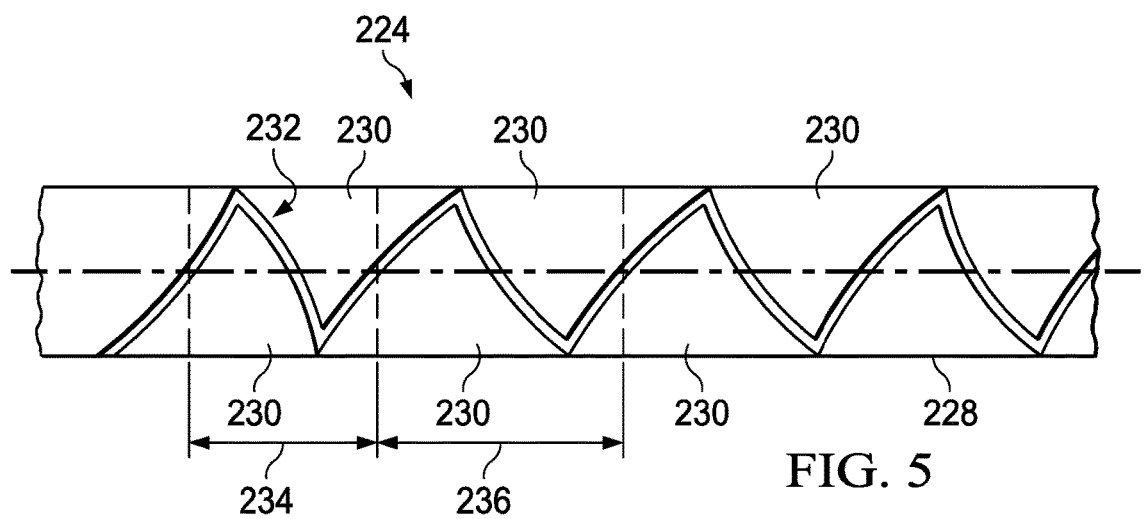
FIG. 5 is a top plan view depicting a shielding tape, in accordance with yet another embodiment.

FIG. 5 illustrates an alternative embodiment of a shielding tape 224 that can be similar to, or the same in many respects as, the shielding tape 24 of FIGS. 1-3. For example, the shielding tape 224 can include a substrate 228 and a plurality of conductive shielding segments 230 disposed on the substrate 228. Each of the conductive shielding segments 230 can cooperate to define a path 232 that includes a first cycle portion 234 and a second cycle portion 236. However, each of the first cycle portion 234 and the second cycle portion 236 can be non-sinusoidally shaped. It is to be appreciated that a cycle portion being non-sinusoidally shaped can be understood to mean that the positive half cycle segment (e.g., 38, 42) is a different shape than the negative half cycle segment (e.g., 40, 44) relative to the centerline (e.g., C1) of the shielding tape 224.

The first and second cycle portions 234, 236 are shown to be similarly shaped such that the non-sinusoidal shape of the path 232 is consistent between the first and second cycle portions 234, 236. As such, each of the conductive shielding segments 230 can be irregular shaped, but can have a substantially similar surface area as the other conductive shielding segments 230.

Figure 6:
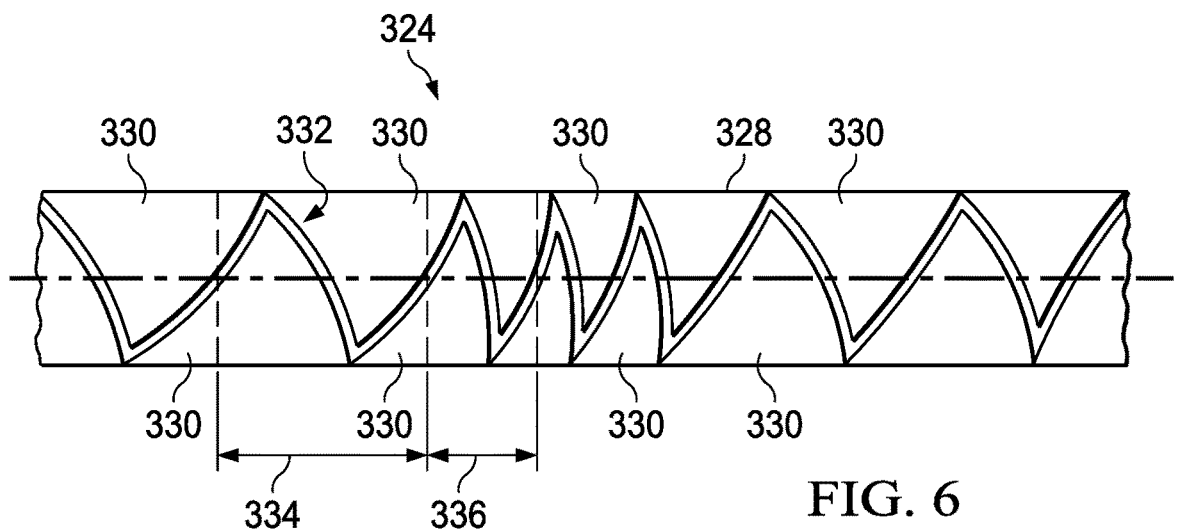
FIG. 6 is a top plan view depicting a shielding tape, in accordance with still yet another embodiment.

FIG. 6 illustrates an alternative embodiment of a shielding tape 324 that can be similar to, or the same in many respects as, the shielding tape 224 of FIG. 5. For example, the shielding tape 324 can include a substrate 328 and a plurality of conductive shielding segments 330 disposed on the substrate 328. Each of the conductive shielding segments 330 can cooperate to define a path 332 that includes a first cycle portion 334 and a second cycle portion 336. Each of the first cycle portion 334 and the second cycle portion 336 can be non-sinusoidally shaped. However, the first and second cycle portions 334, 336 can have different non-sinusoidal shapes. It is to be appreciated that the first and second cycle portions 334, 336 can have any of a variety of different sinusoidal shapes other than that shown in FIG. 6.

Figure 7:
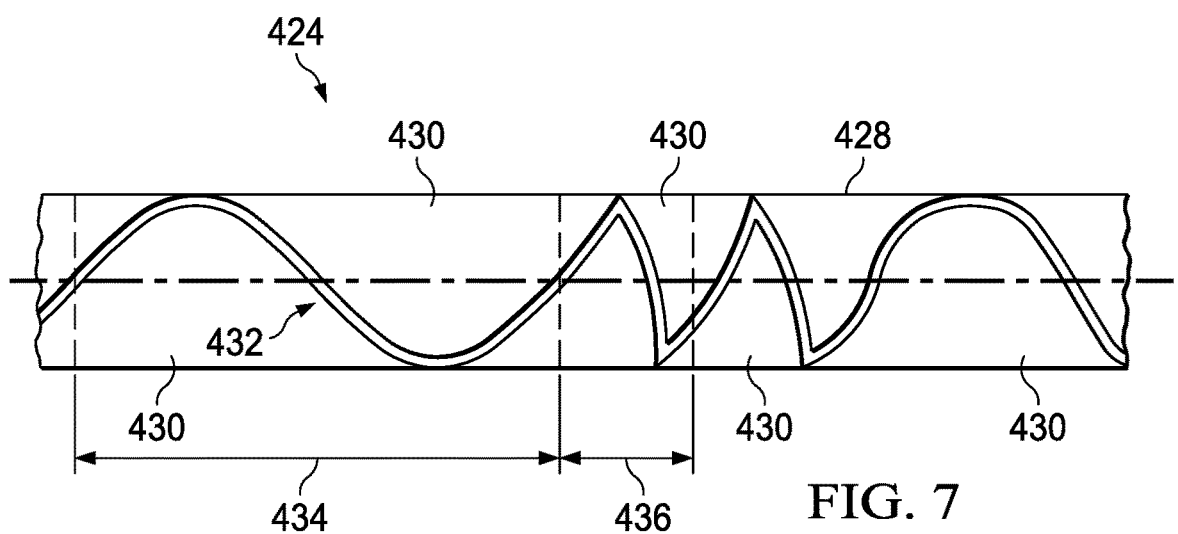
FIG. 7 is a top plan view depicting a shielding tape, in accordance with still yet another embodiment.

FIG. 7 illustrates an alternative embodiment of a shielding tape 424 that can be similar to, or the same in many respects as, the shielding tapes 24 and 224 of FIGS. 1-3 and 5, respectively. For example, the shielding tape 424 can include a substrate 428 and a plurality of conductive shielding segments 430 disposed on the substrate 428. Each of the conductive shielding segments 430 can cooperate to define a path 432 that includes a first cycle portion 434 and a second cycle portion 436. However, the first cycle portion 434 can be sinusoidal-shaped and the second cycle portion 436 can be non-sinusoidally shaped.

Figure 8:
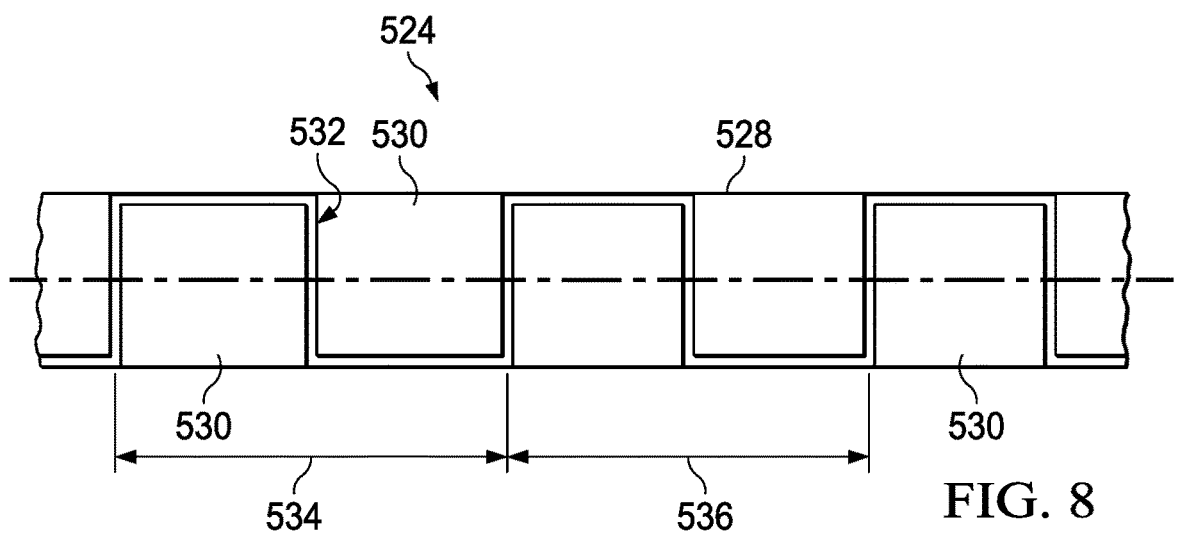
FIG. 8 is a top plan view depicting a shielding tape, in accordance with still yet another embodiment.

FIG. 8 illustrates an alternative embodiment of a shielding tape 524 that can be similar to, or the same in many respects as, the shielding tape 24 of FIGS. 1-3. For example, the shielding tape 524 can include a substrate 528 and a plurality of conductive shielding segments 530 disposed on the substrate 528. Each of the conductive shielding segments 530 can cooperate to define a path 532 that includes a first cycle portion 534 and a second cycle portion 536. However, each of the first cycle portion 534 and the second cycle portion 536 can be shaped like a square wave (e.g., non-sinusoidal). The first and second cycle portions 534, 536 are shown to be similarly shaped such that the square wave shape of the path 532 is consistent between the first and second cycle portions 534, 536. As such, any one of the conductive shielding segment 530 can have a substantially similar surface area as the other conductive shielding segments 530.

Figure 9:
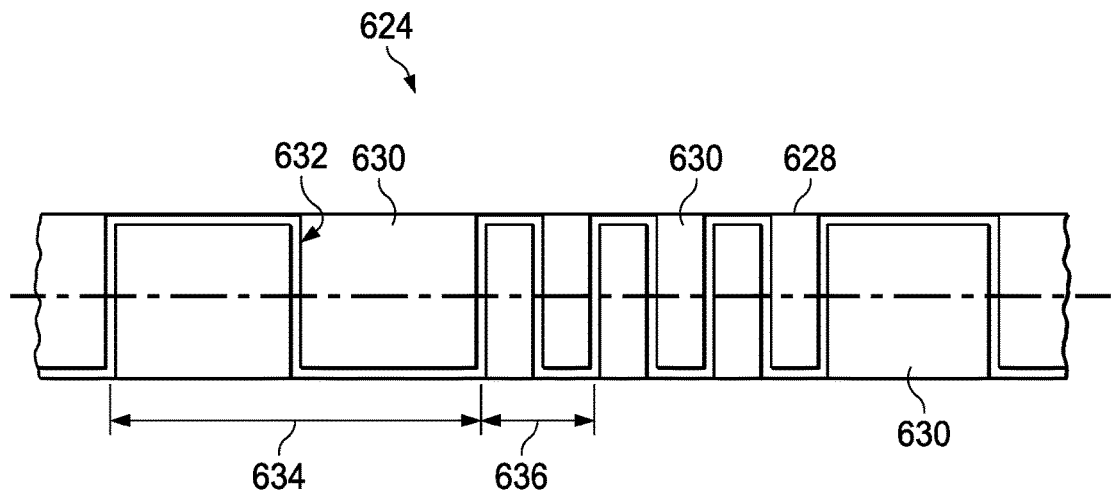
FIG. 9 is a top plan view depicting a shielding tape, in accordance with still yet another embodiment.

FIG. 9 illustrates an alternative embodiment of a shielding tape 624 that can be similar to, or the same in many respects as, the shielding tape 524 of FIG. 8. For example, the shielding tape 624 can include a substrate 628 and a plurality of conductive shielding segments 630 disposed on the substrate 628. Each of the conductive shielding segments 630 can cooperate to define a path 632 that includes a first cycle portion 634 and a second cycle portion 636. Each of the first cycle portion 634 and the second cycle portion 636 can be shaped like a square wave. However, the first and second cycle portions 634, 636 can have different square wave shapes.

Figure 10:
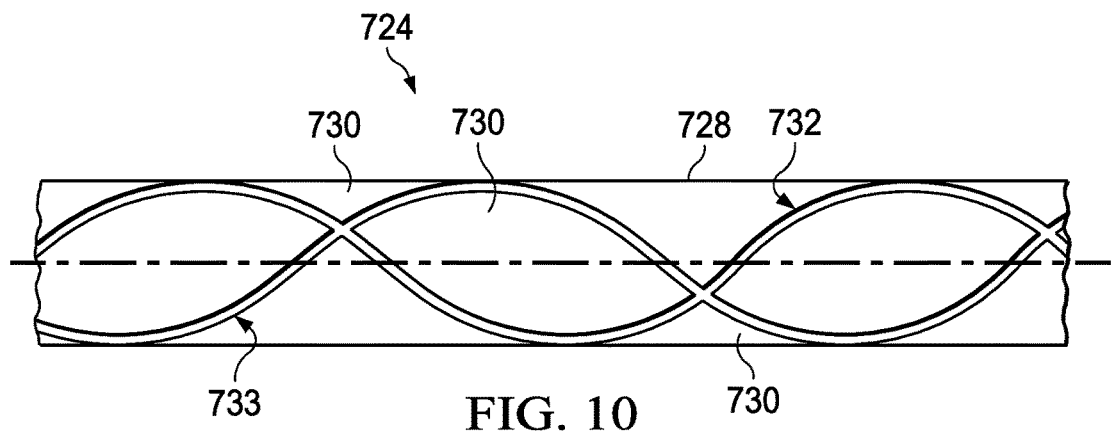
FIG. 10 is a top plan view depicting a shielding tape, in accordance with still yet another embodiment.

FIG. 10 illustrates an alternative embodiment of a shielding tape 724 that can be similar to, or the same in many respects as, the shielding tape 24 of FIGS. 1-3. For example, the shielding tape 724 can include a substrate 728 and a plurality of conductive shielding segments 730 disposed on the substrate 728. However, each of the conductive shielding segments 730 can cooperate to define a first path 732 and a second path 733. Each of the first and second paths 732, 733 can be sinusoidal but can be arranged such that the first and second paths 732, 733 are longitudinally offset from each other and are effectively interwoven with one another. Although the first and second paths 732, 733 are shown to each be sinusoidally shaped, any of a variety of different combinations of interwoven sinusoidal or non-sinusoidal (e.g., square wave) shaped paths are contemplated.

Figure 11:
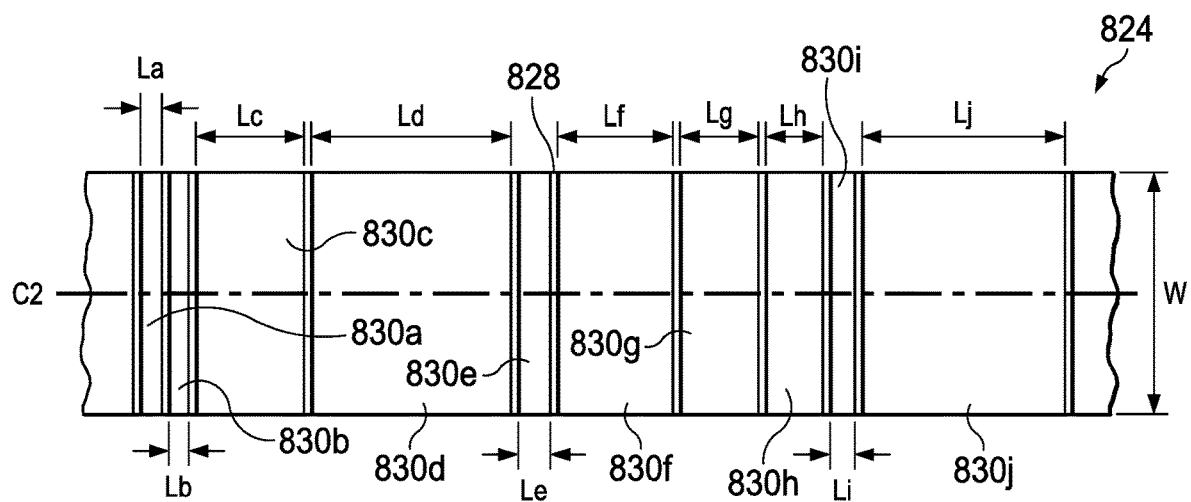
FIG. 11 is a top plan view depicting a shielding tape, in accordance with still yet another embodiment.

FIG. 11 illustrates an alternative embodiment of a shielding tape 824 that can be similar to, or the same in many respects as, the shielding tape 24 of FIGS. 1-3. For example, the shielding tape 824 can include a substrate 828 and a plurality of conductive shielding segments 830a-830j disposed on the substrate 828. Each of the conductive shielding segments 830a-830j can have a respective length La-Lj (measured in a direction that is parallel with a centerline C2). The length (e.g., La-Lj) of each conductive segment can be randomly selected such that each conductive shielding segment can have a different length relative to other conductive shielding segments on the substrate 828. In addition, since the lengths (La-Lj) are randomly selected, the conductive shielding segments might not follow a particular pattern along the length of the shielding tape 824. The substrate 828 can have a width W (measured in a direction that is perpendicular with the centerline C2). Each conductive shielding segment can be about the same width which can be substantially the same as the width of the substrate 828.

The foregoing description of embodiments and examples of the disclosure has been presented for purposes of illustration and description. It is not intended to be exhaustive or to limit the disclosure to the forms described. Numerous modifications are possible in light of the above teachings. Some of those modifications have been discussed and others will be understood by those skilled in the art. The embodiments were chosen and described in order to best illustrate the principles of the disclosure and various embodiments as are suited to the particular use contemplated. The scope of the disclosure is, of course, not limited to the examples or embodiments set forth herein, but can be employed in any number of applications and equivalent devices by those of ordinary skill in the art. Rather it is hereby intended the scope of the invention be defined by the claims appended hereto. Also, for any methods claimed and/or described, regardless of whether the method is described in conjunction with a flow diagram, it should be understood that unless otherwise specified or required by context, any explicit or implicit ordering of steps performed in the execution of a method does not imply that those steps must be performed in the order presented and may be performed in a different order or in parallel.

What is claimed is:
1. A cable comprising:
 a core comprising a first twisted pair of insulated conductors and a second twisted pair of insulated conductors;
 a shielding tape surrounding the first and second twisted pairs of insulated conductors and defining a longitudinal centerline, the shielding tape comprising:
  a dielectric substrate; and
  a shielding substrate disposed on the dielectric substrate and comprising a plurality of conductive shielding segments, each conductive shielding segment of the plurality of conductive shielding segments being spaced from an immediately adjacent conductive shielding segment such that the plurality of conductive shielding segments cooperate to define a path of electrical discontinuity that is routed longitudinally along the dielectric substrate in an oscillating pattern about the longitudinal centerline; and
 an outer jacket surrounding the first and second twisted pairs of insulated conductors and the shielding tape.

2. The cable of claim 1 wherein:
the path comprises a first cycle portion and a second cycle portion; and
the first cycle portion and the second cycle portion are each sinusoidally shaped.

3. The cable of claim 2 wherein the sinusoidal shape of the first cycle portion is the same as the sinusoidal shape of the second cycle portion.

4. The cable of claim 2 wherein the sinusoidal shape of the first cycle portion is different from the sinusoidal shape of the second cycle portion.

5. The cable of claim 1 wherein:
the path comprises a first cycle portion and a second cycle portion; and
the first cycle portion and the second cycle portion are each non-sinusoidally shaped.

6. The cable of claim 2 wherein the non-sinusoidal shape of the first cycle portion is the same as the non-sinusoidal shape of the second cycle portion.

7. The cable of claim 2 wherein the non-sinusoidal shape of the first cycle portion is different from the non-sinusoidal shape of the second cycle portion.

8. The cable of claim 1 wherein the path comprises a cycle portion that is square wave shaped.

9. The cable of claim 1 wherein the core further comprises a third twisted pair of insulated conductors and a fourth twisted pair of insulated conductors.

10. The cable of claim 1 wherein the path is at least 0.05 inches wide.

11. The cable of claim 1 wherein the dielectric substrate comprises a pair of opposing surfaces and one of the opposing surfaces of the pair of opposing surfaces is devoid of any conductive shielding segments.

12. The cable of claim 1 wherein the dielectric substrate is formed substantially of biaxially-oriented polyvinylchloride terephthalate.

13. The cable of claim 1 wherein the plurality of conductive shielding segments is formed substantially of aluminum.

14. A cable comprising:
a core comprising a first twisted pair of insulated conductors and a second twisted pair of insulated conductors;
a shielding tape surrounding the first and second twisted pairs of insulated conductors and comprising:
a dielectric substrate; and
a shielding substrate disposed on the dielectric substrate and comprising a plurality of conductive shielding segments, each conductive shielding segment of the plurality of conductive shielding segments being spaced from an immediately adjacent conductive shielding segment such that the plurality of conductive shielding segments cooperate to define a path of electrical discontinuity that is routed along the dielectric substrate; and
an outer jacket surrounding the first and second twisted pairs of insulated conductors and the shielding tape, wherein:
the path comprises a first cycle portion and a second cycle portion; and
each of the first cycle portion and the second cycle portion are either sinusoidally shaped or non-sinusoidally shaped.

15. The cable of claim 14 wherein the first cycle portion and the second cycle portion are each sinusoidally shaped.

16. The cable of claim 15 wherein the sinusoidal shape of the first cycle portion is the same as the sinusoidal shape of the second cycle portion.

17. The cable of claim 15 wherein the sinusoidal shape of the first cycle portion is different from the sinusoidal shape of the second cycle portion.

18. The cable of claim 14 wherein the first cycle portion and the second cycle portion are each non-sinusoidally shaped.

19. The cable of claim 18 wherein the non-sinusoidal shape of the first cycle portion is the same as the non-sinusoidal shape of the second cycle portion.

20. The cable of claim 18 wherein the non-sinusoidal shape of the first cycle portion is different from the non-sinusoidal shape of the second cycle portion.

21. A cable comprising:
a core comprising a first twisted pair of insulated conductors and a second twisted pair of insulated conductors;
a shielding tape surrounding the first and second twisted pairs of insulated conductors and defining a longitudinal centerline, the shielding tape comprising:
a dielectric substrate; and
a shielding substrate disposed on the dielectric substrate and comprising a plurality of conductive shielding segments, each conductive shielding segment of the plurality of conductive shielding segments being spaced from an immediately adjacent conductive shielding segment such that the plurality of conductive shielding segments cooperate to define a first path of electrical discontinuity and a second path of electrical discontinuity that are each routed longitudinally along the dielectric substrate in an oscillating pattern about the longitudinal centerline; and
an outer jacket surrounding the first and second twisted pairs of insulated conductors and the shielding tape, wherein the first path and the second path are longitudinally offset from each other.

22. A cable comprising:
a core comprising a first twisted pair of insulated conductors and a second twisted pair of insulated conductors;
a shielding tape surrounding the first and second twisted pairs of insulated conductors and defining a longitudinal centerline, the shielding tape comprising:
a dielectric substrate having a width; and
a shielding substrate disposed on the dielectric substrate and comprising a plurality of conductive shielding segments, each conductive shielding segment of the plurality of conductive shielding segments comprising a length and a width, wherein:
the length of each conductive shielding segment of the plurality of conductive shielding segments is different from the lengths of other conductive shielding segments of the plurality of conductive shielding segments; and
the width of each conductive shielding segment of the plurality of conductive shielding segments is substantially the same as the width of the dielectric substrate.

23. The cable of claim 22 wherein the length of each conductive shielding segment is different from the length of at least one immediately adjacent conductive shielding segment.

* * * * *